United States Patent
Pattanayak

(10) Patent No.: US 9,431,249 B2
(45) Date of Patent: Aug. 30, 2016

(54) EDGE TERMINATION FOR SUPER JUNCTION MOSFET DEVICES

(75) Inventor: Deva N. Pattanayak, Saratoga, CA (US)

(73) Assignee: Vishay-Siliconix, Santa Clara, CA (US)

( * ) Notice: Subject to any disclaimer, the term of this patent is extended or adjusted under 35 U.S.C. 154(b) by 10 days.

(21) Appl. No.: 13/309,444

(22) Filed: Dec. 1, 2011

(65) Prior Publication Data

US 2013/0140633 A1 Jun. 6, 2013

(51) Int. Cl.
| | |
|---|---|
| *H01L 29/06* | (2006.01) |
| *H01L 29/66* | (2006.01) |
| *H01L 21/266* | (2006.01) |
| *H01L 29/78* | (2006.01) |
| *H01L 29/40* | (2006.01) |
| *H01L 29/08* | (2006.01) |

(52) U.S. Cl.
CPC ......... *H01L 21/266* (2013.01); *H01L 29/0634* (2013.01); *H01L 29/66712* (2013.01); *H01L 29/7811* (2013.01); *H01L 29/7813* (2013.01); *H01L 29/0615* (2013.01); *H01L 29/0619* (2013.01); *H01L 29/0878* (2013.01); *H01L 29/404* (2013.01)

(58) Field of Classification Search
CPC .................................................. H01L 29/0634
USPC ....................................................... 257/341
See application file for complete search history.

(56) References Cited

U.S. PATENT DOCUMENTS

| | | | |
|---|---|---|---|
| 4,191,603 A | 3/1980 | Garbarino et al. | |
| 4,375,999 A | 3/1983 | Nawata et al. | |
| 4,399,449 A | 8/1983 | Herman et al. | |
| 4,532,534 A | 7/1985 | Ford et al. | |
| 4,584,025 A | 4/1986 | Takaoka et al. | |
| 4,593,302 A | 6/1986 | Lidow et al. | |
| 4,602,266 A | 7/1986 | Coe | |
| 4,620,211 A | 10/1986 | Baliga et al. | |
| 4,646,117 A | 2/1987 | Temple | |
| 4,680,853 A | 7/1987 | Lidow et al. | |
| 4,710,265 A | 12/1987 | Hotta | |
| 4,803,532 A | 2/1989 | Mihara | |
| 4,819,044 A | 4/1989 | Murakami | |

(Continued)

FOREIGN PATENT DOCUMENTS

| | | |
|---|---|---|
| CN | 102194701 A | 9/2011 |
| DE | 3 932 621 | 4/1990 |

(Continued)

OTHER PUBLICATIONS

Takemura et al., "BSA Technology for Sub-100nm Deep Base Bipolar Transistors", Int'l Elec. Devs. Meeting, 1987, pp. 375-378. Jan.

(Continued)

*Primary Examiner* — Eduardo A Rodela
*Assistant Examiner* — Christopher M Roland

(57) ABSTRACT

In one embodiment, a Super Junction metal oxide semiconductor field effect transistor (MOSFET) device can include a substrate and a charge compensation region located above the substrate. The charge compensation region can include a plurality of columns of P type dopant within an N type dopant region. In addition, the Super Junction MOSFET can include a termination region located above the charge compensation region and the termination region can include an N– type dopant. Furthermore, the Super Junction MOSFET can include an edge termination structure. The termination region includes a portion of the edge termination structure.

20 Claims, 12 Drawing Sheets

(56) References Cited

U.S. PATENT DOCUMENTS

| | | |
|---|---|---|
| 4,819,052 A | 4/1989 | Hutter |
| 4,941,026 A | 7/1990 | Temple |
| 4,954,854 A | 9/1990 | Dhong et al. |
| 4,974,059 A | 11/1990 | Kinzer |
| 4,982,249 A | 1/1991 | Kim et al. |
| 5,016,066 A | 5/1991 | Takahashi |
| 5,019,526 A | 5/1991 | Yamane et al. |
| 5,034,338 A | 7/1991 | Neppl et al. |
| 5,034,346 A | 7/1991 | Alter et al. |
| 5,072,266 A | 12/1991 | Bulucea et al. |
| 5,086,007 A | 2/1992 | Ueno |
| 5,087,577 A | 2/1992 | Strack |
| 5,156,993 A | 10/1992 | Su |
| 5,160,491 A | 11/1992 | Mori |
| 5,168,331 A | 12/1992 | Yilmaz |
| 5,171,699 A | 12/1992 | Hutter et al. |
| 5,233,215 A | 8/1993 | Baliga |
| 5,250,449 A | 10/1993 | Kuroyanagi et al. |
| 5,268,586 A | 12/1993 | Mukherjee et al. |
| 5,298,442 A | 3/1994 | Bulucea et al. |
| 5,316,959 A | 5/1994 | Kwan et al. |
| 5,341,011 A | 8/1994 | Hshieh et al. |
| 5,362,665 A | 11/1994 | Lu |
| 5,378,655 A | 1/1995 | Hutchings et al. |
| 5,396,085 A | 3/1995 | Baliga |
| 5,404,040 A | 4/1995 | Hshieh et al. |
| 5,422,508 A | 6/1995 | Yilmaz et al. |
| 5,429,964 A | 7/1995 | Yilmaz et al. |
| 5,497,013 A | 3/1996 | Temple |
| 5,521,409 A | 5/1996 | Hshieh et al. |
| 5,578,508 A | 11/1996 | Baba et al. |
| 5,597,765 A | 1/1997 | Yilmaz et al. |
| 5,614,751 A | 3/1997 | Yilmaz et al. |
| 6,228,700 B1 | 5/2001 | Lee |
| 6,274,904 B1* | 8/2001 | Tihanyi ............... 257/329 |
| 6,465,843 B1 | 10/2002 | Hirler et al. |
| 6,489,204 B1 | 12/2002 | Tsui |
| 6,620,691 B2 | 9/2003 | Hshieh et al. |
| 6,794,239 B2 | 9/2004 | Gonzalez |
| 6,831,345 B2 | 12/2004 | Kinoshita et al. |
| 6,927,451 B1 | 8/2005 | Darwish |
| 7,045,857 B2 | 5/2006 | Darwish et al. |
| 7,122,875 B2 | 10/2006 | Hatade |
| 7,224,022 B2 | 5/2007 | Tokano et al. |
| 7,319,256 B1 | 1/2008 | Kraft et al. |
| 7,335,946 B1 | 2/2008 | Bhalla et al. |
| 7,348,235 B2 | 3/2008 | Fujiishi |
| 7,449,354 B2 | 11/2008 | Marchant et al. |
| 7,504,307 B2 | 3/2009 | Peake |
| 7,704,864 B2 | 4/2010 | Hshieh |
| 7,745,883 B2 | 6/2010 | Williams et al. |
| 7,910,486 B2 | 3/2011 | Yilmaz et al. |
| 7,964,913 B2 | 6/2011 | Darwish |
| 8,076,718 B2 | 12/2011 | Takaya et al. |
| 8,247,296 B2 | 8/2012 | Grivna |
| 8,334,566 B2 | 12/2012 | Tai |
| 8,803,207 B2 | 8/2014 | Grebs et al. |
| 2001/0026989 A1 | 10/2001 | Thapar |
| 2001/0050394 A1* | 12/2001 | Onishi et al. ............ 257/343 |
| 2002/0016034 A1 | 2/2002 | Gonzalez |
| 2002/0030237 A1 | 3/2002 | Omura et al. |
| 2002/0123196 A1 | 9/2002 | Chang et al. |
| 2003/0011046 A1* | 1/2003 | Qu ................... 257/598 |
| 2003/0085422 A1 | 5/2003 | Amali et al. |
| 2003/0193067 A1* | 10/2003 | Kim et al. ............ 257/343 |
| 2004/0021173 A1 | 2/2004 | Sapp |
| 2004/0021174 A1 | 2/2004 | Kobayashi |
| 2004/0113201 A1 | 6/2004 | Bhalla et al. |
| 2004/0222458 A1 | 11/2004 | Hsieh et al. |
| 2004/0222461 A1* | 11/2004 | Peyre-Lavigne et al. .... 257/333 |
| 2005/0062124 A1 | 3/2005 | Chiola |
| 2005/0215011 A1 | 9/2005 | Darwish et al. |
| 2006/0014349 A1 | 1/2006 | Williams et al. |
| 2006/0209887 A1 | 9/2006 | Bhalla et al. |
| 2006/0214242 A1 | 9/2006 | Carta et al. |
| 2006/0267090 A1 | 11/2006 | Sapp et al. |
| 2006/0273390 A1 | 12/2006 | Hshieh et al. |
| 2007/0040217 A1 | 2/2007 | Saito et al. |
| 2007/0155104 A1 | 7/2007 | Marchant et al. |
| 2007/0290257 A1 | 12/2007 | Kraft et al. |
| 2008/0042172 A1 | 2/2008 | Hirler et al. |
| 2008/0090347 A1* | 4/2008 | Huang et al. .............. 438/197 |
| 2008/0197407 A1 | 8/2008 | Challa et al. |
| 2008/0211020 A1 | 9/2008 | Saito |
| 2008/0290403 A1 | 11/2008 | Ono et al. |
| 2009/0020810 A1 | 1/2009 | Marchant |
| 2009/0079002 A1 | 3/2009 | Lee et al. |
| 2009/0085099 A1 | 4/2009 | Su et al. |
| 2009/0090967 A1 | 4/2009 | Chen et al. |
| 2009/0206440 A1 | 8/2009 | Schulze et al. |
| 2009/0315104 A1 | 12/2009 | Hsieh |
| 2010/0006935 A1* | 1/2010 | Huang et al. ............ 257/341 |
| 2010/0078775 A1* | 4/2010 | Mauder et al. ........... 257/655 |
| 2010/0233667 A1 | 9/2010 | Wilson et al. |
| 2010/0289032 A1 | 11/2010 | Zhang et al. |
| 2010/0311216 A1 | 12/2010 | Marchant |
| 2011/0001189 A1 | 1/2011 | Challa et al. |
| 2011/0089486 A1 | 4/2011 | Xu et al. |
| 2011/0089488 A1 | 4/2011 | Yilmaz et al. |
| 2011/0233667 A1 | 9/2011 | Tai et al. |
| 2013/0069145 A1 | 3/2013 | Kawano et al. |
| 2013/0187196 A1 | 7/2013 | Kadow |
| 2013/0207227 A1 | 8/2013 | Azam et al. |
| 2013/0214355 A1* | 8/2013 | Fang et al. ............ 257/343 |
| 2013/0320462 A1 | 12/2013 | Tipirneni et al. |

FOREIGN PATENT DOCUMENTS

| | | |
|---|---|---|
| DE | 112006003618 T5 | 11/2008 |
| EP | 0227894 | 7/1987 |
| EP | 0279403 A2 | 8/1988 |
| EP | 0310047 A2 | 4/1989 |
| EP | 0 345 380 | 12/1989 |
| EP | 0 580 213 | 1/1994 |
| EP | 0 583 023 | 2/1994 |
| EP | 0 620 588 | 10/1994 |
| FR | 2 647 596 | 11/1990 |
| GB | 2033658 | 5/1980 |
| GB | 2087648 | 5/1982 |
| GB | 2134705 | 8/1984 |
| GB | 2137811 | 10/1984 |
| GB | 2166290 | 4/1986 |
| JP | 56-58267 | 5/1981 |
| JP | 59-84474 | 5/1984 |
| JP | 59-141267 | 8/1984 |
| JP | 60-249367 | 12/1985 |
| JP | 61-80860 | 4/1986 |
| JP | 62-176168 | 8/1987 |
| JP | 1-42177 | 2/1989 |
| JP | 1-198076 | 8/1989 |
| JP | 1-310576 | 12/1989 |
| JP | 2-91976 | 3/1990 |
| JP | 3273180 | 4/2002 |
| JP | 2002-540603 | 11/2002 |
| JP | 2003-101039 | 4/2003 |
| JP | 2003-179223 | 6/2003 |
| JP | 2005-209983 | 8/2005 |
| JP | 2005-286328 | 10/2005 |
| JP | 2006005275 | 1/2006 |
| JP | 2006-128507 | 5/2006 |
| JP | 2006-310782 | 11/2006 |
| JP | 2007-157799 | 6/2007 |
| JP | 2008294214 | 12/2008 |
| JP | 2011192824 | 9/2011 |
| KR | 10-2012-0027299 | 3/2012 |
| WO | 2006027739 | 3/2006 |
| WO | 2007002857 | 1/2007 |
| WO | 2010/132144 A1 | 11/2010 |

OTHER PUBLICATIONS

S.C. Sun et al., "Modeling of the On-Resistance of LDMOS, VDMOS, and VMOS Power Transistors", IEEE Trans. Electron Devices, vol. ED-27, No. 2, Feb. 1980, pp. 356-367.

(56) References Cited

OTHER PUBLICATIONS

P. Ou-Yang, "Double Ion Implanted V-MOS Technology", IEEE Journal of Solid State Circuits, vol. SC-12, No. 1, Feb. 1977, pp. 3-10.

D. Jaume et al, "High-Voltage Planar Devices Using Field Plate and Semi-Resistive Layers", IEEE Trans. on Electron Devices, vol. 38, No. 7, Jul. 1991, pp. 1681-1684.

Baliga, "Modern Power Devices", A Wiley-Interscience Publication, John Wiley & Sons, Inc., 1987, pp. 62-131.

Barbuscia et al., "Modeling of Polysilicon Dopant Diffusion for Shallow-Junction Bipolar Technology", IEDM, 1984, pp. 757-760, No Month.

K. Shenai et al., "Optimum Low-Voltage Silicon Power Switches Fabricated Using Scaled Trench MOS Technologies", IEEE, International Electron Devices Meeting, Dec. 9, 1990, San Francisco, USA, pp. 793-797.

Antognetti, "Power Integrated Circuits: Physics, Design, and Applications," McGraw-Hill Book Co., 1986, pp. 3.14-3.27, Dec.

"SMP60N06, 60N05, SMP50N06, 50N05, N-Channel Enhancement Mode Transistors," MOSPOWER Data Book, Siliconix inc., 1988, pp. 4-423-4-426.

Chang et al., "Vertical FET Random-Access Memories With Deep Trench Isolation," IBM Technical Disclosure Bulletin, vol. 22, No. 8B, Jan. 1980, pp. 3683-3687.

Patent Application As Filed for U.S. Appl. No. 14/663,872; Inventors: Misbah Ul Azam et al.; filed Mar. 20, 2015; "MOSFET Termination Trench."

Deboy et al., "A new generation of high voltage MOSFETs breaks the limit line of silicon," IEDM '98, Technical Digest, International, Dec. 1998, pp. 683-685, IEEE.

Lorenz et al., "COOLMOS(TM)—a new milestone in high voltage Power MOS," Proceedings of the 11th International Symposium on Power Semiconductor Devices & ICs, 1999, pp. 3-10, IEEE.

Saito et al., "A 20 mΩ • cm2 600V-class Superjunction MOSFET," Proceedings of 2004 International Symposium on Power Semiconductor Devices & ICs, pp. 459-462.

Iwamoto et al., "Above 500V class Superjunction MOSFETs fabricated by deep trench etching and epitaxial growth," Proceedings of the 17th International Symposium on Power Semiconductor Devices & ICs, May 23-26, 2005, pp. 31-34, IEEE.

Kim et al.,"New Power Device Figure of Merit for High-Frequency Applications," Proceedings of 1995 International Symposium on Power Semiconductor Devices & ICs, pp. 309-314.

Antoniu et al., "Towards Achieving the Soft-Punch-Through Superjunction Insulated-Gate Bipolar Transistor Breakdown Capability," IEEE Electron Device Letters, vol. 32, No. 9, Sep. 2011, pp. 1275-1277.

Shenoy et al., "Analysis of the Effect of Charge Imbalance on the Static and Dynamic Characteristics of the Superjunction MOSFET," Proceedings of the 11th International Symposium on Power Semiconductor Devices & ICs, 1999, pp. 99-102, IEEE.

A. Q. Huang, "New Unipolar Switching Power Device Figures of Merit," IEEE Electron Device Letters, vol. 25, No. 5, May, 2004, pp. 298-301.

* cited by examiner

EDGE TERMINATION FOR SUPER JUNCTION MOSFET DEVICES

BACKGROUND

There are different types of edge terminations used in metal-oxide semiconductor field-effect transistor (MOSFET) devices. For example, in conventional MOSFETs the edge termination consists of a set of floating field rings/field plates across which the potential drops in a step wise fashion from the source potential to the drain potential. Recently a new type of MOSFET, commonly known as Super Junction MOSFET (SJMOSFET), has been designed that employs order of magnitude higher drift layer concentration resulting in very low on resistance for a given breakdown voltage. This is accomplished by the incorporation of P type vertical junction regions in the core drift region. The field ring based edge termination used for a conventional MOSFET is deemed unsuitable for the SJMOSFET. Its breakdown voltage will be much lower than the core breakdown voltage. As such, different edge termination schemes are generally employed.

For example, one of the edge terminations used for the SJMOSFET is a source field plate running over a thick low temperature oxide (LTO) layer over the termination region. The source field plate together with the floating P columns underneath it supports the source drain potential. While this is an acceptable edge termination for the SJMOSFET and is used commonly, it has the drawback of causing electric arcing between the unexposed areas of the source metal field plate and the drain for breakdown voltage higher than the potential at which air breakdown takes place (around 400V). In order to avoid electric arcing between the source field plate and the drain, the field plate is covered with a passivation layer, such as silicon nitrogen (SiN). However, because of the brittle characteristics of SiN and also the sharp features of the etched metal field plate edges, passivation cracks occur leading to the generation of arcing to air. To avoid such arcing potential it is necessary to cover the metal with a crack free passivation layer.

Therefore, while there are advantages associated with Super Junction MOSFET devices, there are also disadvantages associated with them when it comes to the edge termination areas. As explained earlier, one of the disadvantages is that when a field plate is incorporated into a Super Junction MOSFET device, a thick oxide (e.g., approximately 5-6 micrometers thick for a 600V device) is utilized. It is also necessary to coat the field plate with passivation material, such as SiN and Polyimide in order to prevent electrical arcing between the edge of the metal field plate and the drain (the scribe line).

SUMMARY

Given the disadvantages associated with the edge termination areas of Super Junction MOSFET devices, it is desirable that a field ring based edge termination be designed which drops the potential gradually from that of the source potential to the drain potential which does not stress the source metal above the ionizing potential of air.

In one embodiment, a Super Junction MOSFET device can include a substrate and a charge compensation region located above the substrate. The charge compensation region can include a plurality of columns of P type dopant within an N type dopant region. In addition, the Super Junction MOSFET can include a termination region located above the charge compensation region and the termination region can include an N− type dopant. Furthermore, the Super Junction MOSFET can include an edge termination structure. The termination region includes a portion of the edge termination structure.

In an embodiment, the Super Junction MOSFET device described above can further include a field effect transistor, wherein the termination region includes a portion of the field effect transistor. In accordance with various embodiments, the edge termination structure mentioned above can include, but is not limited to, a field ring, a field plate, and/or a junction termination extension. In addition, in various embodiments, the edge termination structure mentioned above can include, but is not limited to, a set of field rings and field plates. In one embodiment, the edge termination structure mentioned above can include, but is not limited to, a set of field plates. In an embodiment, the edge termination structure mentioned above can include, but is not limited to, a junction termination extension region. In one embodiment, the field effect transistor described above can include a P type dopant region that merges with one of the plurality of columns of P type dopant. In an embodiment, the field effect transistor described above includes a junction field effect transistor.

In another embodiment, a Super Junction MOSFET device can include a substrate and a charge compensation region located above the substrate. The charge compensation region can include a plurality of columns of N type dopant within a P type dopant region. Additionally, the Super Junction MOSFET can include a termination region located above the charge compensation region and the termination region can include a P− type dopant. Moreover, the Super Junction MOSFET can include an edge termination structure, wherein the termination region includes a portion of the edge termination structure.

In one embodiment, the Super Junction MOSFET device described in the previous paragraph can further include a field effect transistor, wherein the termination region includes a portion of the field effect transistor. In accordance with various embodiments, the edge termination structure mentioned in the previous paragraph can include, but is not limited to, a field ring, a field plate, and/or a junction termination extension. Furthermore, in various embodiments, the edge termination structure mentioned above can include, but is not limited to, a set of field rings and field plates. In one embodiment, the edge termination structure mentioned above can include, but is not limited to, a set of field plates. In an embodiment, the edge termination structure mentioned above can include, but is not limited to, a junction termination extension region. In an embodiment, the field effect transistor described in the previous paragraph can include an N type dopant region that merges with one of the plurality of columns of N type dopant. In one embodiment, the field effect transistor described in the previous paragraph includes a junction field effect transistor.

In yet another embodiment, a method can include generating a charge compensation region of a Super Junction MOSFET device. Note that the charge compensation region is located above a substrate and includes a plurality of columns of first type dopant within a second type dopant region. Furthermore, the method can include generating a termination region located above the charge compensation region and including a lower concentration of the second type dopant than the second type dopant layer. Additionally, the method can include generating an edge termination structure such that the termination region includes at least a portion of the edge termination structure.

In one embodiment, the first type dopant described in the previous paragraph includes a P type dopant and the second type dopant includes an N type dopant. In an embodiment, the first type dopant described in the previous paragraph includes an N type dopant and the second type dopant includes a P type dopant. In accordance to various embodiments, the edge termination structure described in the previous paragraph can be selected from the group of a field ring, a field plate, and a junction termination extension. Additionally, in various embodiments, the edge termination structure described in the previous paragraph can include, but is not limited to, a set of field rings and field plates. In one embodiment, the edge termination structure described in the previous paragraph can include, but is not limited to, a set of field plates. In an embodiment, the edge termination structure described in the previous paragraph can include, but is not limited to, a junction termination extension region. In one embodiment, the method described in the previous paragraph can further include generating a field effect transistor such that the termination region includes at least a portion of the field effect transistor. In an embodiment, the generating the field effect transistor further includes generating the field effect transistor that includes a region of the first type dopant that merges with one of the plurality of columns of first type dopant.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings.

Figure 1:
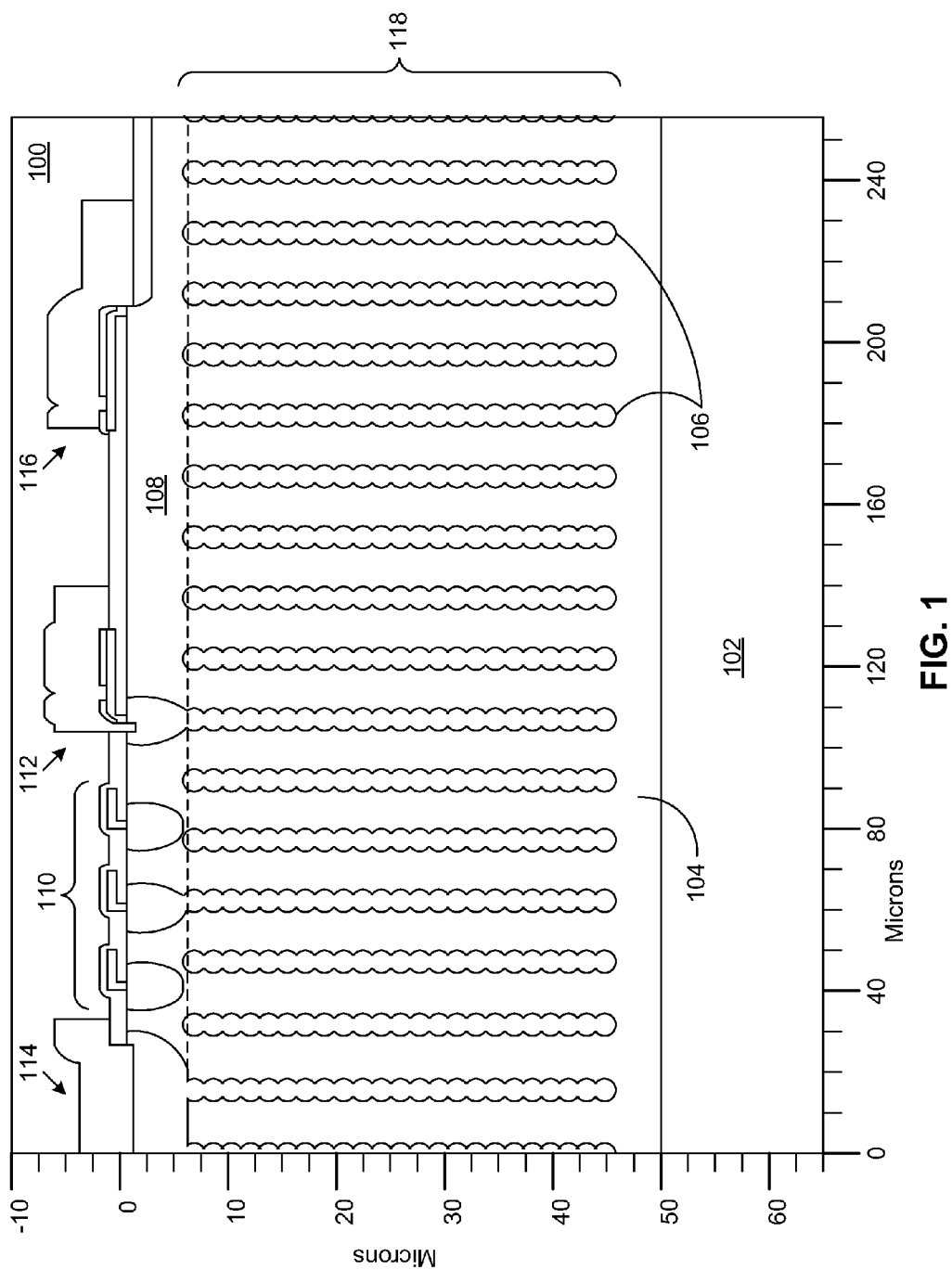
FIG. 1 is a side sectional view of an edge termination area of a Super Junction MOSFET device in accordance with various embodiments of the invention.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "generating," "creating," "forming," "performing," "producing," "depositing," "etching" or the like, refer to actions and processes of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the invention can be implemented in conjunction with these other (perhaps conventional) processes and steps without significantly perturbing them. Generally speaking, embodiments in accordance with the invention can replace portions of a conventional process without significantly affecting peripheral processes and steps.

As used herein, the letter "N" refers to an N− type dopant and the letter "P" refers to a P− type dopant. A plus sign "+"

or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device. Note that the figures are discussed in the context of an n-channel device, specifically an n-channel Super Junction MOSFET. However, embodiments in accordance with the invention are not so limited. The discussion of the figures can be readily mapped to a p-channel device by substituting n-type dopant and materials for corresponding p-type dopant and materials, and vice versa.

FIG. 1 is a side sectional view of an edge termination area of a Super Junction metal-oxide semiconductor field-effect transistor (MOSFET) device 100 in accordance with various embodiments of the invention. In one embodiment, the Super Junction MOSFET device 100 can include a substrate 102 and a charge compensation region 118 located above and coupled to the substrate 102. The charge compensation region 118 can include multiple P regions or columns 106 within an N epitaxial region 104. As such, the charge compensation region 118 can include alternating N and P regions which form what is known as a Super Junction. In addition, the Super Junction MOSFET device 100 can include a termination region 108 located above and coupled to the charge compensation region 118, wherein the termination region 108 can be implemented as an N− epitaxial layer. Within the present embodiment, the Super Junction MOSFET device 100 can include one or more field rings 110, one or more field plates 112, a source 114, and a drain 116. In addition, in one embodiment the drain 116 is connected to a drain (not shown) located beneath the substrate 102. It is pointed out that the termination region 108 of the Super Junction MOSFET device 100 can include at least a portion of the one or more field rings 110 and the one or more field plates 112.

Note that the Super Junction MOSFET device 100 can be implemented in a wide variety of ways in accordance with embodiments of the invention. For example in an embodiment, the Super Junction MOSFET device 100 can include one or more edge termination structures, wherein the termination region 108 can include at least a portion of each of the edge termination structures. It is pointed out that the edge termination structures of the Super Junction MOSFET device 100 can be implemented in a wide variety of ways. For example, the edge termination structures can include, but are not limited to, one or more field rings 110, one or more field plates 112, and/or one or more junction termination extensions (JTEs). In one embodiment, the edge termination structures can include, but are not limited to, a set of field rings 110 and field plates 112. In an embodiment, the edge termination structures can include, but are not limited to, a set of field plates 112. In an embodiment, the edge termination structures can include, but are not limited to, one or more junction termination extension regions.

Within FIG. 1, it is noted that the P regions 106 can be generated or created in a wide variety of ways in accordance with embodiments of the invention. For example, as shown in the present embodiment, the P regions 106 can be generated by forming multiple heavier doped N epitaxial layers 104 above substrate 102 and implanting within each layer multiple P regions (e.g., boron) such that the resulting implanted P regions are vertically stacked. Next, an N− epitaxial layer 108 can be formed above the multiple N epitaxial layers 104 implanted with vertically stacked P regions. Subsequently, when the stacked implanted P regions of the different epitaxial layers 104 are thermally defused, the stacked implanted P regions vertically merge together to form multiple P regions or columns 106 as shown in the present embodiment. It is pointed out that additional figures and description are included herein involving the generation of the P columns 106 in this manner.

Within FIG. 1, in one embodiment of the Super Junction MOSFET device 100, it is noted that the doping of the top termination region 108 (e.g., N− epitaxial layer) is lighter or has a lower concentration than the doping of the N epitaxial region 104. In an embodiment, one way of forming the termination region 108 is by implanting an N− dopant into the top surface of the N epitaxial region 104 thereby creating the termination layer 108 having an N− epitaxial layer. Moreover, note that the top termination layer 108 can be implemented in a wide variety of ways. For example in one embodiment, the net doping of the N− epitaxial layer 108 can be implemented at approximately $2.6 \times 10^{14}/cm^3$ while the net doping of the N epitaxial region 104 can be implemented at approximately $3 \times 10^{15}/cm^3$.

Furthermore, in an embodiment, note that the thickness of the edge termination layer 108 can be chosen and implemented such that any P body regions of the MOSFET section may merge with one or more of the P columns 106 of the charge compensation region 118. In addition, field rings 110, field plates 112, and/or JTEs (not shown in FIG. 1) can each be constructed as part of the edge termination section 108. Within the present embodiment of the Super Junction MOSFET device 100, two of the field rings 110 along with the field plate 112 touch the P columns 106 of the charge compensation region 118. However, it is noted that in one embodiment, the Super Junction MOSFET device 100 can be implemented such that none of the P regions 106 touch any field rings 110 and/or any field plates 112.

Within FIG. 1, in an embodiment, the Super Junction MOSFET device 100 can be implemented such that the charge compensation region 118 extends all the way into the termination region or layer 108. Moreover, the termination layer 108 can include any MOS gate structures in the active region in addition to any field rings 110, field plates 112, and/or any JTE regions. One of the advantages of the Super Junction MOSFET device 100 is that the surface electric field is substantially lower than the bulk electric field at the breakdown voltage, which increases the ruggedness of the device 100. Additionally, another advantage of the edge termination region of the Super Junction MOSFET device 100 is that it does not involve the use of implementing metal field plate over thick low temperature oxide (LTO) and it also does not involve utilizing polyimide passivation to prevent arcing.

It is pointed out that FIG. 1 includes both an X-axis and Y-axis that illustrate the cross sectional size of the Super Junction MOSFET device 100. Specifically, the X-axis of FIG. 1 includes a micron (or micrometer) scale while the Y-axis includes a micron (or micrometer) scale.

Note that the Super Junction MOSFET device 100 may not include all of the elements illustrated by FIG. 1. Additionally, the Super Junction MOSFET device 100 can be implemented to include one or more elements not illustrated by FIG. 1. It is pointed out that the Super Junction MOSFET device 100 can be utilized or implemented in any manner similar to that described herein, but is not limited to such.

Figure 2:
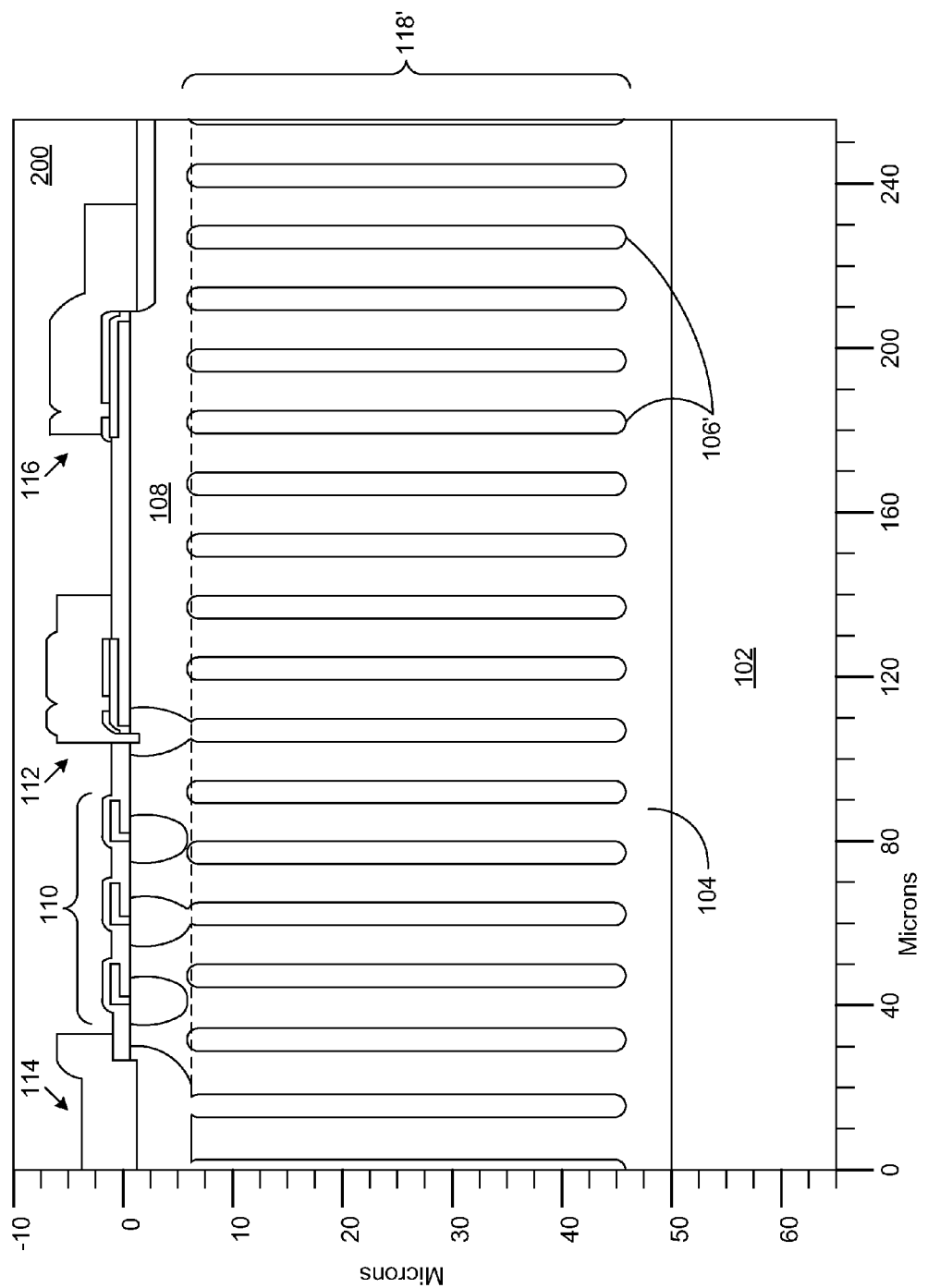
FIG. 2 is side sectional view of another edge termination area of a Super Junction MOSFET device in accordance with various embodiments of the invention.

FIG. 2 is a side sectional view of an edge termination area of a Super Junction MOSFET device 200 in accordance with various embodiments of the invention. Note that the Super Junction MOSFET device 200 of FIG. 2 is similar to the Super Junction MOSFET device 100 of FIG. 1. However, the P regions or columns 106' of the Super Junction MOSFET device 200 are fabricated in a different manner than that shown within the Super Junction MOSFET device 100 of FIG. 1.

Specifically, the P regions 106' of the Super Junction MOSFET device 200 can be generated by forming a heavier doped N epitaxial region 104 above and coupled to the substrate 102. Subsequently, a deep trench etch process can be performed to create or generate multiple trenches within the N epitaxial region 104. Afterward, a P type dopant material is filled or formed within the multiple trenches of the N epitaxial region 104 thereby generating or creating the P regions or columns 106'. Next, an N− epitaxial layer can be formed above a charge compensation region 118' to generate or create the termination region 108 which also encapsulates the P regions or columns 106'. It is pointed out that additional figures and description are included herein involving the generation of the P columns 106' in this manner. Note that in one embodiment, just one set of masks is used to create the P regions 106' within the N channel Super Junction MOSFET device 200.

It is noted that the Super Junction MOSFET device 200 may not include all of the elements illustrated by FIG. 2. Moreover, the Super Junction MOSFET device 200 can be implemented to include one or more elements not illustrated by FIG. 2. Note that the Super Junction MOSFET device 200 can be utilized or implemented in any manner similar to that described herein, but is not limited to such.

Figure 3:
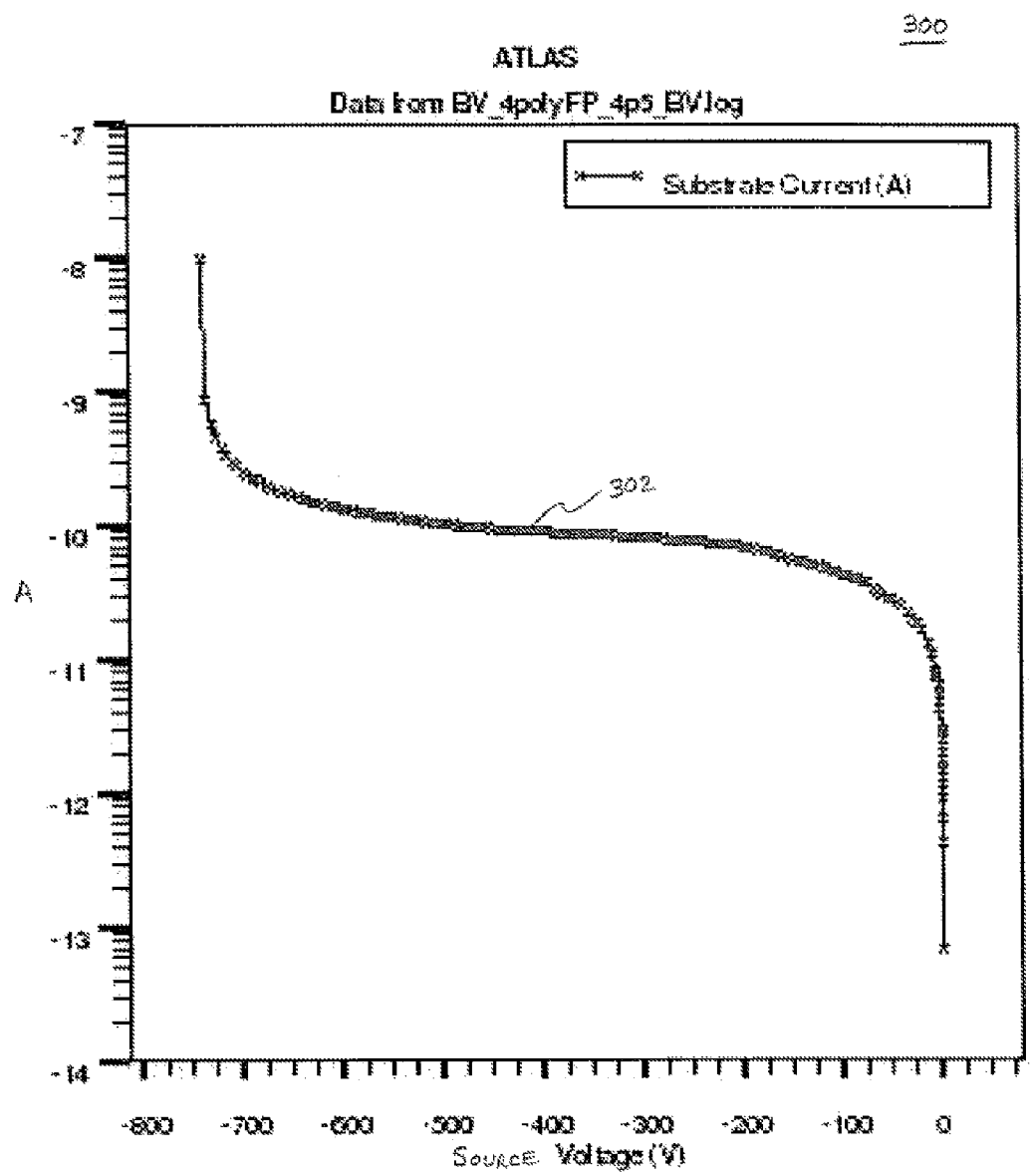
FIG. 3 is a graph of the current/voltage breakdown characteristic of a simulated Super Junction MOSFET device including an edge termination area in accordance with various embodiments of the invention.

FIG. 3 is a graph 300 that illustrates the current/voltage breakdown characteristic of the simulated Super Junction MOSFET device 200 which includes an edge termination area in accordance with various embodiments of the invention. Specifically, the X-axis of the graph 300 represents the source voltage (V) of the simulated Super Junction MOSFET device 200 while the Y-axis of the graph 300 represents the substrate current (A) of the simulated Super Junction MOSFET device 200. In addition, curve 302 of the graph 300 represents the current/voltage breakdown characteristic of the simulated Super Junction MOSFET device 200.

Figure 4:
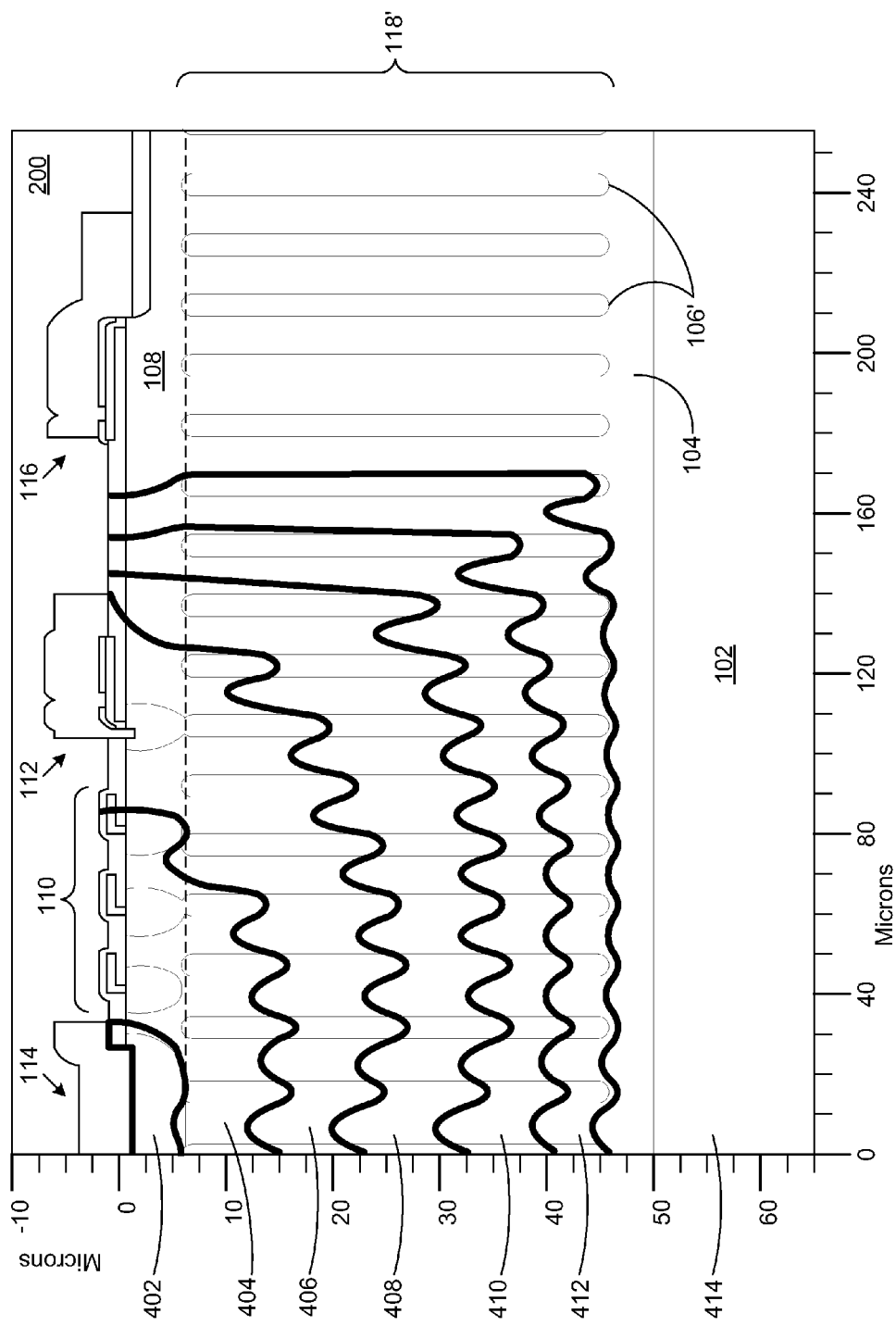
FIG. 4 illustrates a potential distribution at the breakdown voltage of a simulated Super Junction MOSFET device including an edge termination area in accordance with various embodiments of the invention.

FIG. 4 illustrates a potential distribution at the breakdown voltage of the simulated Super Junction MOSFET device 200 which includes an edge termination area in accordance with various embodiments of the invention. Within FIG. 4, it can be seen that the charge compensation area is depleted both vertically and laterally. For example, the vertical depletion region width is approximately 45 microns (or micrometers) and the lateral depletion width is approximately 120 microns (or micrometers) from the edge of the P body which is at the Source potential. As such, the size of the Super Junction MOSFET device 200 can be reduced when implemented in accordance with an embodiment of the invention. It is pointed out that reference numeral 410 indicates the bulk breakdown of the Super Junction MOSFET device 200, which is a desirable result.

It is pointed out that reference numeral 402 indicates the area of the simulated Super Junction MOSFET device 200 that is at the breakdown voltage of approximately 740 V, reference numeral 404 indicates the area of the simulated Super Junction MOSFET device 200 that is at approximately 648 V, and reference numeral 406 indicates the area that is at approximately 463 V. Furthermore, reference numeral 408 indicates the area of the simulated Super Junction MOSFET device 200 that is at approximately 277 V while reference numeral 410 indicates the area that is at approximately 175 V. Moreover, reference numeral 412 indicates the area of the simulated Super Junction MOSFET device 200 that is at approximately 65 V while reference numeral 414 indicates the area that is at approximately 0.629 V.

It is pointed out that FIG. 4 includes both an X-axis and Y-axis. Specifically, the X-axis of FIG. 4 includes a micron (or micrometer) scale while the Y-axis also includes a micron (or micrometer) scale.

Figure 5:
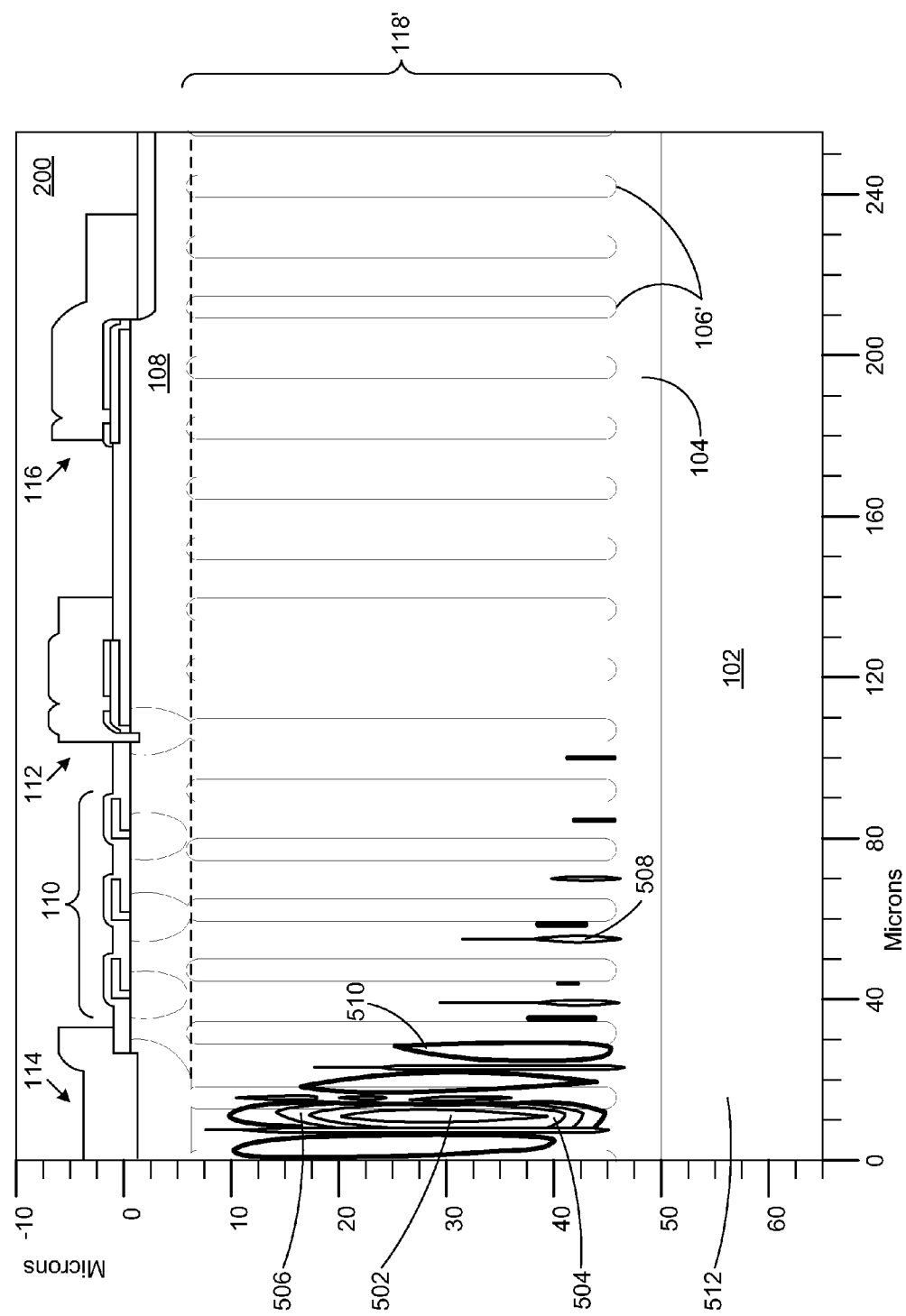
FIG. 5 illustrates an impact ionization distribution at the breakdown voltage of a simulated Super Junction MOSFET device including an edge termination area in accordance with various embodiments of the invention.

FIG. 5 illustrates an impact ionization distribution at the breakdown voltage of the simulated Super Junction MOSFET device 200 which includes an edge termination area in accordance with various embodiments of the invention. Note that within FIG. 5, as indicated by reference numeral 502, the impact ionization occurs inside the bulk away from the surface as can be seen from the distribution of the impact ionization rate at the breakdown voltage. As such, this improves the ruggedness of the Super Junction MOSFET devices 100 and 200.

More specifically within an embodiment, it is noted that reference numeral 502 indicates an area of the simulated Super Junction MOSFET device 200 that has an impact generation rate of approximately 20.7/cm 3 s while reference numeral 504 indicates an area having an impact generation rate of approximately 20.1/cm 3 s. In addition, reference numeral 506 indicates an area of the simulated Super Junction MOSFET device 200 having an impact generation rate of approximately 19.7/cm 3 s while reference numeral 508 indicates an area having an impact generation rate of approximately 19/cm 3 s. Additionally, reference numeral 510 indicates an area of the simulated Super Junction MOSFET device 200 that has an impact generation rate of approximately 18.7/cm 3 s while reference numeral 512 indicates an area having an impact generation rate of approximately 18/cm 3 s.

Note that FIG. 5 includes both an X-axis and Y-axis. Specifically, the X-axis of FIG. 5 includes a micron (or micrometer) scale while the Y-axis also includes a micron (or micrometer) scale.

Figure 6:
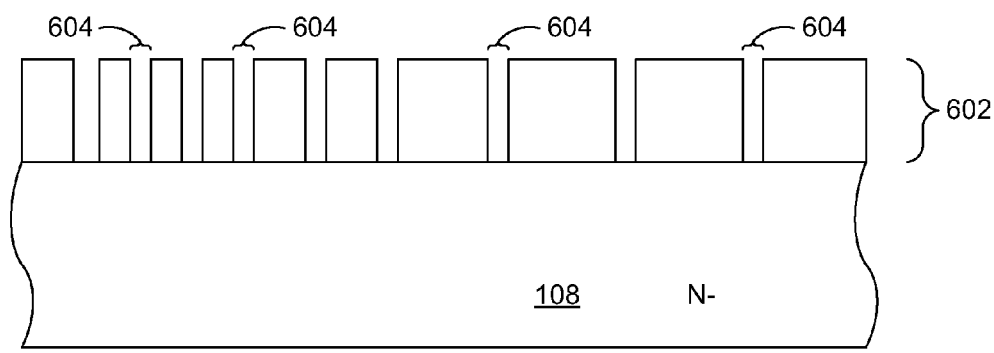
FIGS. 6-8 illustrate a process for fabricating a junction termination extension (JTE) within an edge termination area of a Super Junction MOSFET device in accordance with various embodiments of the invention.
Figure 7:
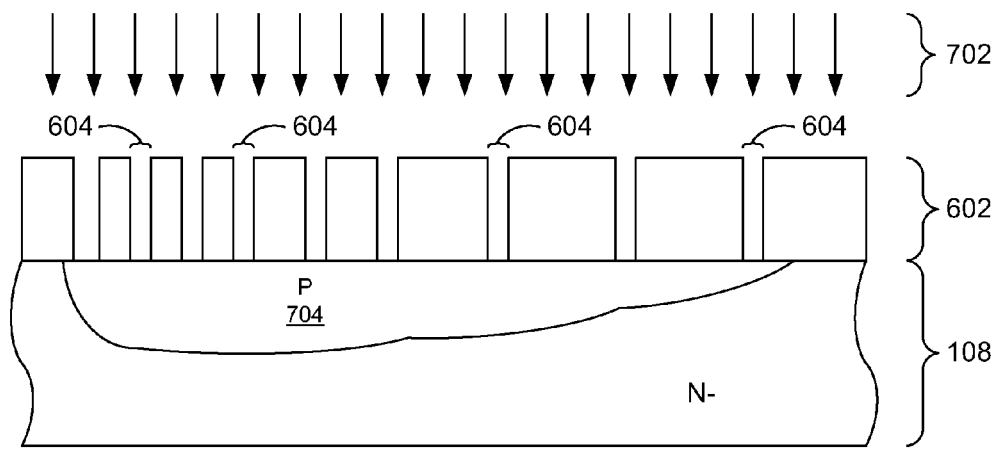
Figure 8:
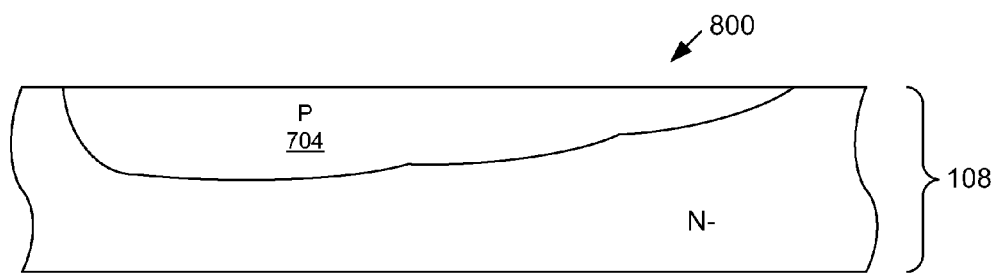

FIGS. 6-8 illustrate a process for fabricating a junction termination extension (JTE) 800 within the edge termination area 108 of a Super Junction MOSFET device (e.g., 100 or 200) in accordance with various embodiments of the invention.

Specifically, FIG. 6 is a side sectional view of a mask 602 that has been implemented above or onto the edge termination area 108 of the Super Junction MOSFET device in accordance with various embodiments of the invention. The mask 602 can be implemented in a wide variety of ways. For example in an embodiment, the mask 602 can be implemented with a photoresist, but is not limited to such. It is pointed out that the mask 602 can include multiple holes or openings 604 that extend through the mask 602. Note that within the present embodiment there are more holes 604 within the mask 602 towards its left end while there are less holes 604 within the mask 602 towards its right end.

FIG. 7 is a side sectional view of a P implant 702 directed towards the mask 602 and the edge termination area 108 of the Super Junction MOSFET device in accordance with various embodiments of the invention. It is noted that the P implant 702 can be implemented in a wide variety of ways. For example in one embodiment, the P implant 702 can be implemented as a boron implant, but is not limited to such. Note that some of the P implant 702 may pass through the holes 604 of the mask 602 while some of the P implant 702 may be blocked by the remaining portions of the mask 602. As such, the P implant 702 that pass through the holes 604 create P doping 704 of the N− edge termination area 108. In addition, given the spacing of the holes 604 within the mask 602 of the present embodiment, the P doping 704 results in a laterally varying doping within the edge termination area 108. Specifically, there is a higher concentration of P doping 704 within the N− edge termination area 108 where there are more holes 604 within the mask 602 that allow the P implant 702 to pass through and a lower concentration of P doping 704 within the edge termination area 108 where there are less holes 604 within the mask 602.

FIG. 8 is a side sectional view of a junction termination extension (JTE) 800 within the edge termination area 108 of the Super Junction MOSFET device in accordance with various embodiments of the invention. More specifically, after the completion of the P implant 702 shown within FIG. 7, the mask 602 can be removed from the upper surface of the edge termination area 108. Note that the removal of the mask 602 can be performed in a wide variety of ways. For example in one embodiment, the mask 602 can be removed by an etching process, but is not limited to such. After the mask 602 has been removed, junction termination extension 800 remains within the edge termination area 108. It is noted that the junction termination extension 800 can be referred to as an edge termination structure. Note that the junction termination extension 800 can be utilized or implemented in any manner similar to that described herein, but is not limited to such.

Figure 9:
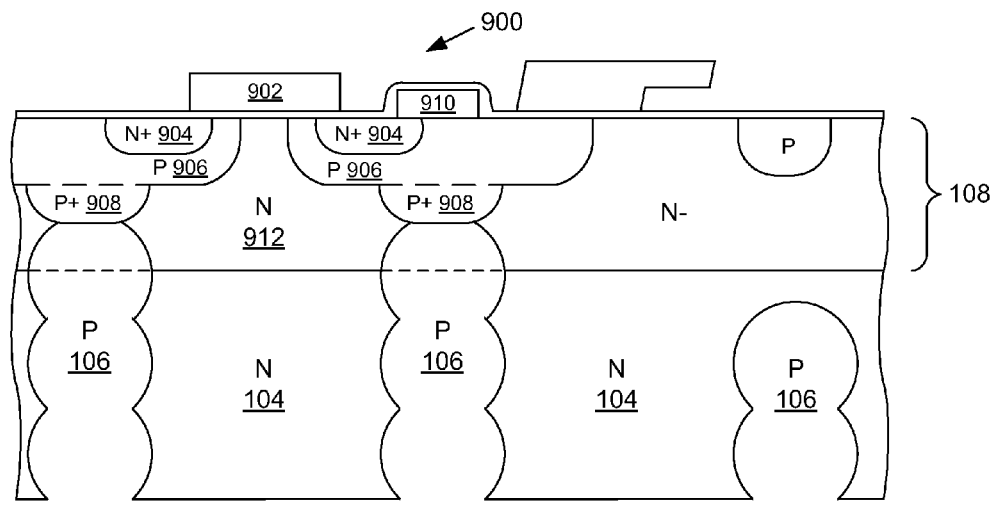
FIG. 9 is a side sectional view of a planar Junction Field Effect Transistor (JFET) implemented as part of a termination area of a Super Junction MOSFET device in accordance with various embodiments of the invention.

FIG. 9 is a side sectional view of a planar Junction Field Effect Transistor (JFET) 900 implemented as part of the termination area 108 of the Super Junction MOSFET device 100 in accordance with various embodiments of the invention. The JFET 900 can include, but is not limited to, a gate 902, N+ dopant regions 904, P dopant regions 906, P+ dopant regions 908, a contact 910, an N dopant region 912, and an N− dopant region of the termination area 108. It is pointed out that the P+ dopant regions 908 of the JFET 900 are each in contact with a P region or column 106. Note that the N dopant region 912 located between the P dopant regions 906 is the channel of the JFET 900. When implemented in this manner, the resistance can be optimized of the JFET 900.

It is pointed out that the JFET 900 may not include all of the elements illustrated by FIG. 9. In addition, the JFET 900 can be implemented to include one or more elements not illustrated by FIG. 9. Note that the JFET 900 can be utilized or implemented in any manner similar to that described herein, but is not limited to such.

Figure 10:
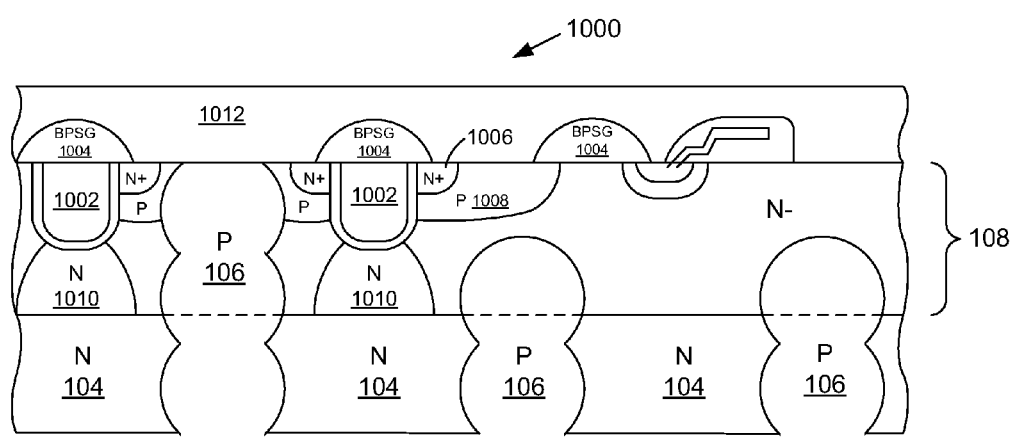
FIG. 10 is a side sectional view of an edge termination area of a trench Super Junction MOSFET device in accordance with various embodiments of the invention.

FIG. 10 is a side sectional view of an edge termination area 108 of a trench Super Junction MOSFET device 1000 in accordance with various embodiments of the invention. The trench Super Junction MOSFET device 1000 can include, but is not limited to, a trench gate 1002, N+ dopant regions 1006, P dopant regions 1008, an N dopant region 1010, an N− dopant regions of the termination area 108, and borophosilicate glass (BPSG) 1004. Note that the P dopant regions 1008 contact a P region or column 106 while the N dopant regions 1010 are in contact with the N epitaxial region 104. In addition, the trench Super Junction MOSFET device 1000 includes a source 1012 that can be implemented with a metal, but is not limited to such.

It is noted that the trench Super Junction MOSFET device 1000 may not include all of the elements illustrated by FIG. 10. Moreover, the trench Super Junction MOSFET device 1000 can be implemented to include one or more elements not illustrated by FIG. 10. It is pointed out that the trench Super Junction MOSFET device 1000 can be utilized or implemented in any manner similar to that described herein, but is not limited to such.

Figure 11:
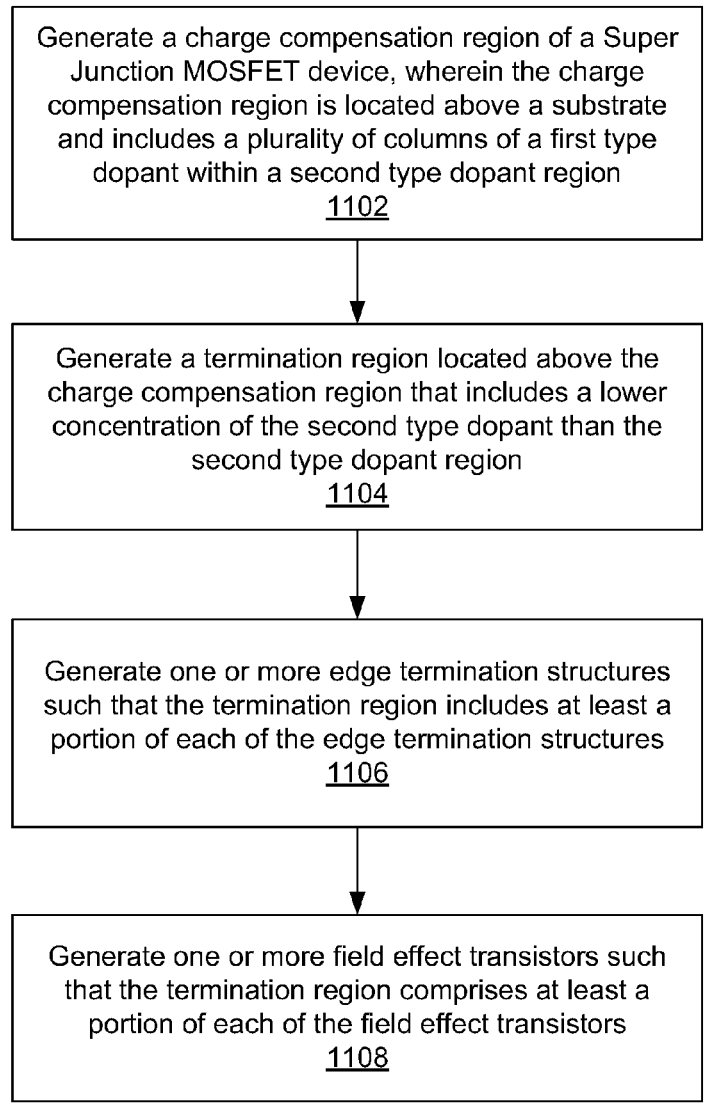
FIG. 11 is flow diagram of a method in accordance with various embodiments of the invention.

FIG. 11 is a flow diagram of a method 1100 in accordance with various embodiments of the invention. Although specific operations are disclosed in FIG. 11, such operations are examples. The method 1100 may not include all of the operations illustrated by FIG. 11. Also, method 1100 may include various other operations and/or variations of the operations shown. Likewise, the sequence of the operations of flow diagram 1100 can be modified. It is appreciated that not all of the operations in flow diagram 1100 may be performed. In various embodiments, one or more of the operations of method 1100 can be controlled or managed by software, by firmware, by hardware or by any combination thereof, but is not limited to such. Method 1100 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

FIG. 11 is a flow diagram of a method 1100 in accordance with various embodiments of the invention for fabricating a Super Junction MOSFET. For example, method 1100 can include generating a charge compensation region of a Super Junction MOSFET device, wherein the charge compensation region is coupled to a substrate and includes a plurality of columns of a first type dopant within a second type dopant region. In addition, a termination region can be generated that is located above and coupled to the charge compensation region and that includes a lower concentration of the second type dopant than the second type dopant region. Furthermore, an edge termination structure can be generated such that the termination region includes at least a portion of the edge termination structure. Moreover, one or more field effect transistors can be generated such that the termination region includes at least a portion of each of the field effect transistors. In this manner, a Super Junction MOSFET can be fabricated in accordance with various embodiments of the invention.

At operation 1102 of FIG. 11, a charge compensation region (e.g., 118) can be generated or created of a Super Junction MOSFET device (e.g., 100 or 200), wherein the charge compensation region is located above a substrate (e.g., 102) and includes a plurality of columns (e.g., 106 or 106') of a first type dopant within a second type dopant region (e.g., 104). It is pointed out that operation 1102 can be implemented in a wide variety of ways.

For example in one embodiment, at operation 1102 the generating of the plurality of columns of the charge compensation region can include forming the second type dopant region above and coupled to the substrate. Subsequently, a deep trench etch process can be performed in order to create or generate multiple trenches within the second type dopant region. Afterward, the first type dopant material can be filled or formed within the multiple trenches of the second type dopant region thereby generating or creating the plurality of columns.

In an embodiment, at operation 1102 the generating of the plurality of columns of the charge compensation region can include forming multiple layers of second type dopant above the substrate and implanting within each layer multiple regions of first type dopant such that the resulting implanted first type dopant regions are vertically stacked. Accordingly, when the implanted first type dopant regions of the different second type dopant layers are subsequently defused (e.g., thermally diffused), the stacked implanted first type dopant regions vertically merge together in order to form multiple first type dopant regions or columns. Note that operation 1102 can be implemented in any manner similar to that described herein, but is not limited to such.

At operation 1104, a termination region (e.g., 108) can be generated that is located above and coupled to the charge compensation region and that includes a lower concentration of the second type dopant than the second type dopant region (e.g., 104). It is noted that operation 1104 can be implemented in a wide variety of ways. For example, operation 1104 can be implemented in any manner similar to that described herein, but is not limited to such.

At operation 1106 of FIG. 11, one or more edge termination structures (e.g., 110, 112 and/or 800) can be generated such that the termination region (e.g., 108) includes at least a portion of each of the edge termination structures. Note that operation 1106 can be implemented in a wide variety of ways. For example, operation 1106 can be implemented in any manner similar to that described herein, but is not limited to such.

At operation 1108, one or more field effect transistors (e.g., 900) can be generated such that the termination region (e.g., 108) includes at least a portion of each of the field effect transistors. It is noted that operation 1108 can be implemented in a wide variety of ways. For example, operation 1108 can be implemented in any manner similar to that described herein, but is not limited to such. In this manner, a Super Junction MOSFET can be fabricated in accordance with various embodiments of the invention.

Figure 12:
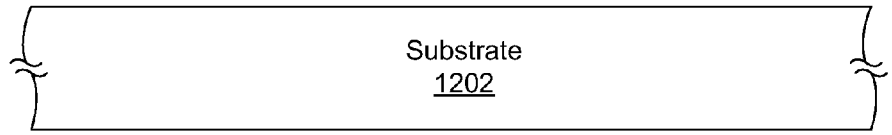
FIGS. 12-24 illustrate a process for fabricating multiple P regions or columns as part of a Super Junction MOSFET device in accordance with various embodiments of the invention.

FIGS. 12-24 illustrate a process for fabricating multiple P regions or columns (e.g., 106) as part of a Super Junction MOSFET device (e.g., 100) in accordance with various embodiments of the invention. For example, the process can begin in FIG. 12 which is a side sectional view of a substrate 1202 that can be utilized to fabricate a Super Junction MOSFET device in accordance with various embodiments of the invention. It is pointed out that the substrate 1202 can be implemented in a wide variety of ways. For example in one embodiment, the substrate 1202 can be implemented as a silicon substrate, but is not limited to such.

Figure 13:
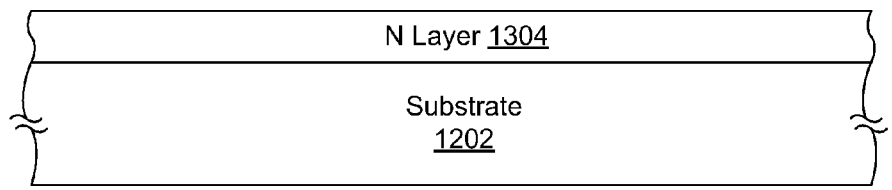

FIG. 13 is a side sectional view of an N doped epitaxial layer 1304 that can be formed or grown above or on top of the substrate 1202 in accordance with various embodiments of the invention.

Figure 14:
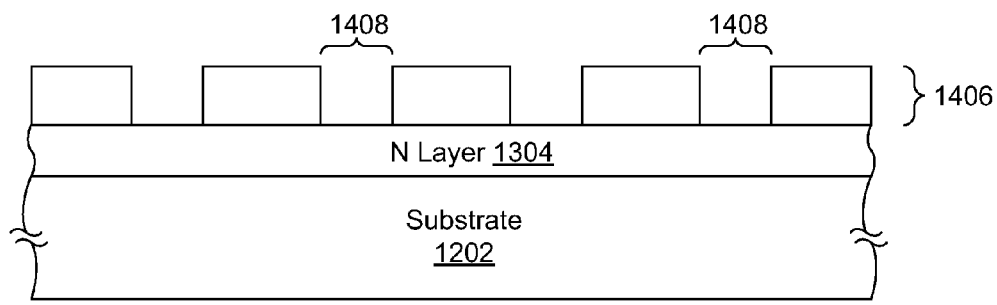

FIG. 14 is a side sectional view of a mask 1406 that has been implemented above or on top of the N doped epitaxial layer 1304 in accordance with various embodiments of the invention. The mask 1406 can be implemented in a wide variety of ways. For example in one embodiment, the mask 1406 can be implemented with a photoresist, but is not limited to such. It is noted that the mask 1406 can include multiple holes or openings 1408 that extend through the mask 1406. Note that the holes 1408 within the mask 1406 are positioned in the desired location for fabricating the P regions or columns (e.g., 106) within the Super Junction MOSFET device (e.g., 100).

Figure 15:
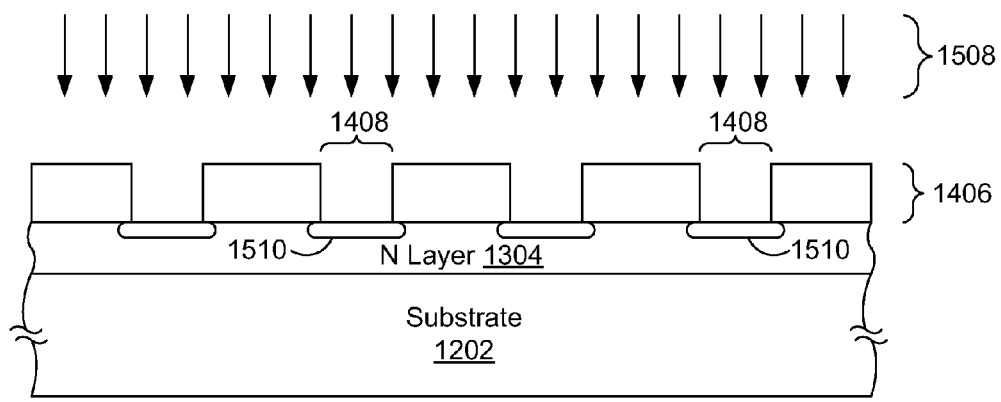

FIG. 15 is a side sectional view of a P implant 1508 directed towards the mask 1406 and the N doped epitaxial layer 1304 in accordance with various embodiments of the invention. Note that the P implant 1508 can be implemented in a wide variety of ways. For example in an embodiment, the P implant 1508 can be implemented as, but is not limited to, a boron implant. It is pointed out that some of the P implant 1508 may pass through the holes 1408 of the mask 1406 while some of the P implant 1508 may be blocked by the remaining portions of the mask 1406. Accordingly, the P implant 1508 that pass through the holes 1408 create implanted P doping regions 1510 within the N doped epitaxial layer 1304.

Figure 16:
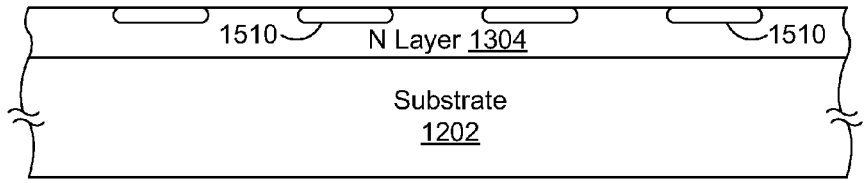

After the completion of the P implant 1508 shown within FIG. 15, FIG. 16 illustrates that the mask 1406 can be removed from the upper surface of the N doped epitaxial layer 1304 in accordance with various embodiments of the invention. Note that the removal of the mask 1406 can be performed in a wide variety of ways. For example, the mask 1406 can be removed by an etching process or Chemical Mechanical Polishing (CMP), but is not limited to such.

Figure 17:
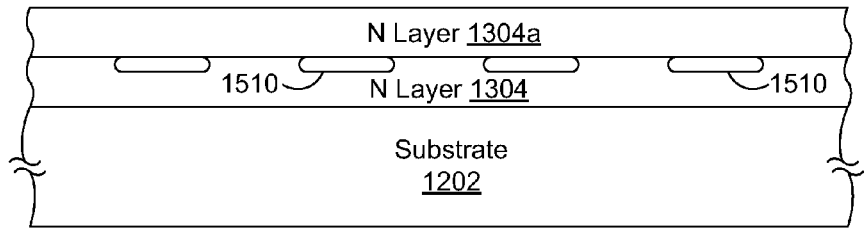

FIG. 17 is a side sectional view of a second N doped epitaxial layer 1304a that can be formed or grown above or on top of the N doped epitaxial layer 1304 implanted with the P doping regions 1510 in accordance with various embodiments of the invention.

Figure 18:
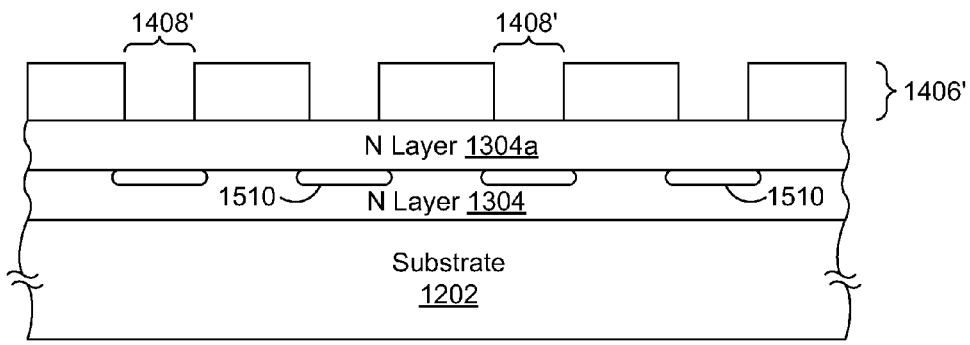

FIG. 18 is a side sectional view of a mask 1406' that has been implemented above or on top of the N epitaxial layer 1304a in accordance with various embodiments of the invention. The mask 1406' can be implemented in a wide variety of ways. For example in an embodiment, the mask 1406' can be implemented with, but is not limited to, a photoresist. It is pointed out that the mask 1406' can include multiple holes or openings 1408' that extend through the mask 1406'. Note that the holes 1408' within the mask 1406' are positioned above the implanted P doping regions 1510 located within the N epitaxial layer 1304.

Figure 19:
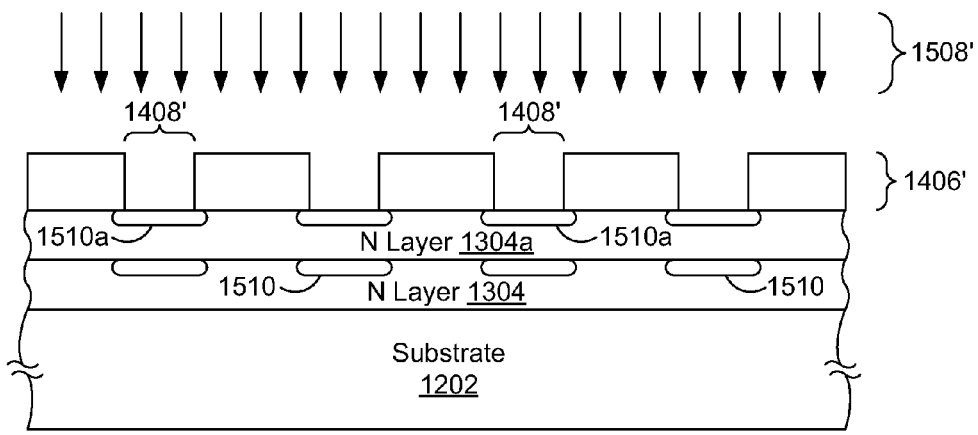

FIG. 19 is a side sectional view of a P implant 1508' directed towards the mask 1406' and the N epitaxial layer 1304a in accordance with various embodiments of the invention. It is pointed out that the P implant 1508' can be implemented in a wide variety of ways. For example in one embodiment, the P implant 1508' can be implemented as a boron implant, but is not limited to such. It is noted that some of the P implant 1508' may pass through the holes 1408' of the mask 1406' while some of the P implant 1508' may be blocked by the remaining portions of the mask 1406'. Therefore, the P implant 1508' that pass through the holes 1408' create implanted P doping regions 1510a within the N epitaxial layer 1304a.

Figure 20:
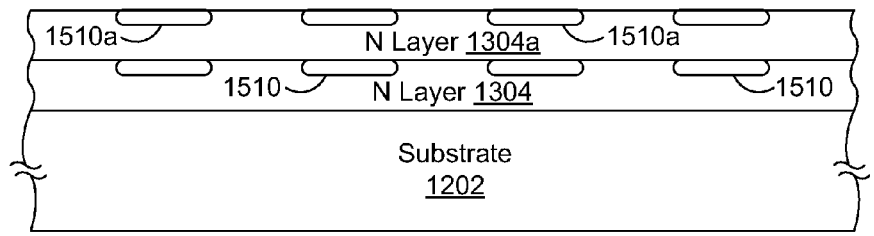

After the completion of the P implant 1508' shown within FIG. 19, FIG. 20 illustrates that the mask 1406' can be removed from the upper surface of the N epitaxial layer 1304a in accordance with various embodiments of the invention. It is pointed out that the removal of the mask 1406' can be performed in a wide variety of ways. For example, the mask 1406' can be removed from the upper surface of the N epitaxial layer 1304a by an etching process or CMP, but is not limited to such.

Figure 21:
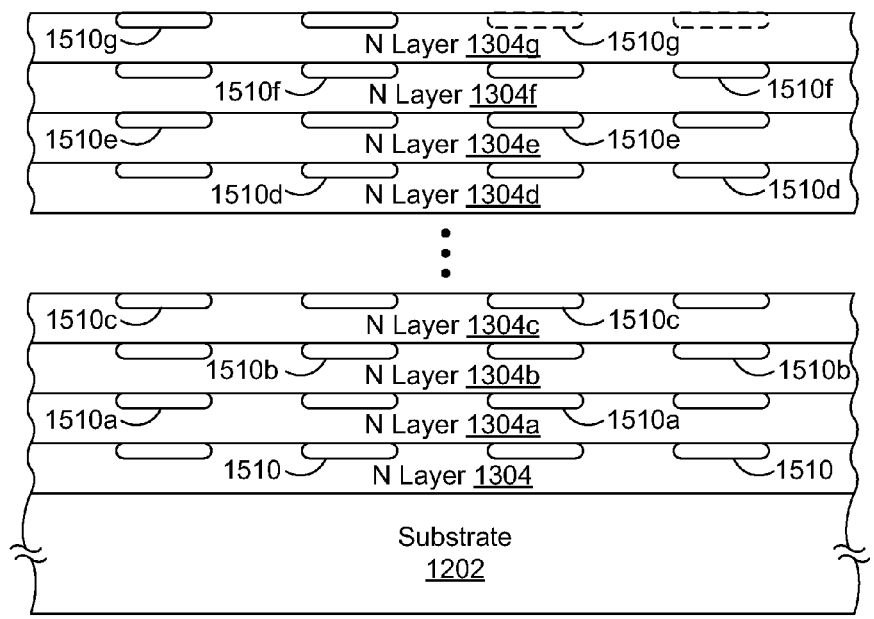

It is noted that after the completion of the removal of the mask 1406' as shown within FIG. 20, the operations associated with FIGS. 17-20 can be repeated one or more times in order to fabricate more stacked layers of N epitaxial layers implanted with P doping regions. For example, FIG. 21 is a side sectional view of vertically stacked N epitaxial layers 1304, 1304a, 1304b, 1304c, 1304d, 1304e, 1304f, and 1304g each implanted with P doping regions 1510, 1510a, 1510b, 1510c, 1510d, 1510e, 1510f, and 1510g, respectively, in accordance with various embodiments of the invention. In various embodiments, note that a greater or lesser number of vertically stacked N epitaxial layers implanted with P doping regions can be fabricated than are currently shown in the present embodiment of FIG. 21. Within the present embodiment, it is pointed out that the N epitaxial layer 1304g includes two dashed P doping regions 1510g which indicate that they may or may not be implanted within the N epitaxial layer 1304g. For example in an embodiment, it may be desirable to implant less P doping regions within one or more of the N epitaxial layers (e.g., 1304g) as implanted within the other N epitaxial layers (e.g., 1304-1304f).

Figure 22:
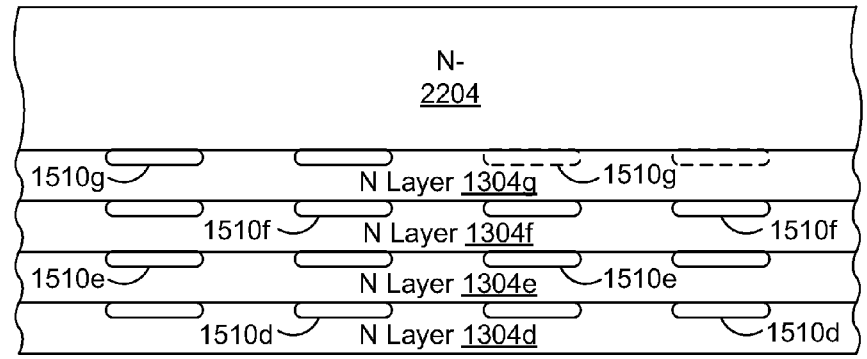

After the desired number of stacked N epitaxial layers implanted with P doping regions are fabricated above the substrate 1202 as shown in FIG. 21, FIG. 22 illustrates that an N− epitaxial layer 2204 can be formed above the multiple N epitaxial layers (e.g., 1304-1304g) implanted with vertically stacked P regions (e.g., 1510-1510g) in accordance with various embodiments of the invention. It is noted that the N− epitaxial layer 2204 can be formed in a wide variety of ways. For example in an embodiment, an N doped epitaxial layer can be formed or grown above or on top of the N doped epitaxial layer 1304g. Next, an N− dopant can be implanted into that N doped epitaxial layer thereby creating the N− epitaxial layer 2204, which can be referred to as a termination layer. It is pointed out that while the substrate 1202 and N epitaxial layers 1304-1304c are not shown within FIG. 22, they remain beneath the N epitaxial layers 1304d as shown within FIG. 21.

Figure 23:
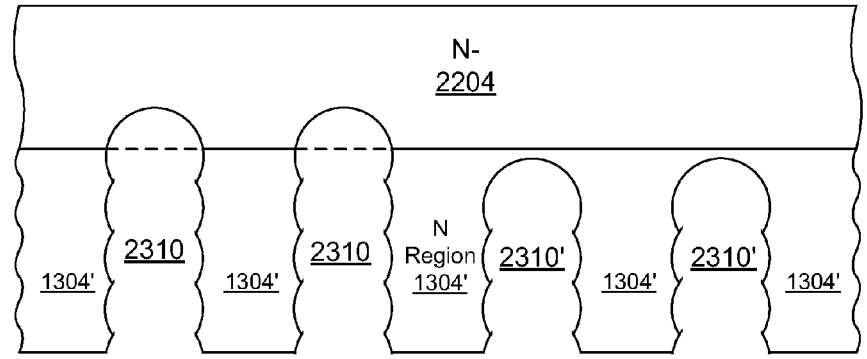

After the N− epitaxial layer 2204 is formed, FIG. 23 illustrates the thermal diffusion of the implanted P doping regions 1510-1510g thereby causing them to vertically merge together to form multiple P regions or columns 2310 and 2310' in accordance with various embodiments of the invention. Within the present embodiment of FIG. 23, it is noted that the dashed P doping regions 1510g were not implanted within the N epitaxial layer 1304g so that the P regions or columns 2310' did not thermally diffuse into the N− epitaxial layer 2204. However, during the thermal diffusion the implanted P doping regions 1510g diffused into the N− epitaxial layer 2204. In addition, during the thermal diffusion the multiple N epitaxial layers 1304-1304g vertically merged together to form N epitaxial region 1304'. It is noted that while the substrate 1202 and N epitaxial layers 1304-1304c are not shown within FIG. 23, they remain beneath the N epitaxial layers 1304d. Furthermore, the thermal diffusion can cause the vertically stacked P doping regions 1510-1510c to vertically merge together to form multiple P regions or columns 2310 in a manner similar to that shown within FIG. 23. Moreover, the thermal diffusion can cause the multiple N epitaxial layers 1304-1304c to vertically merge together to form N epitaxial region 1304' in a manner similar to that shown within FIG. 23.

Figure 24:
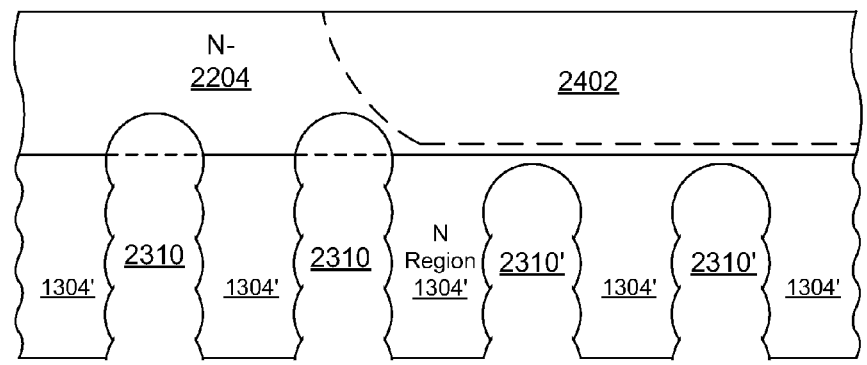

FIG. 24 illustrates additional area 2402 available for fabricating one or more semiconductor devices within the N− epitaxial layer or termination layer 2204 in accordance with various embodiments of the invention. It is pointed out that in one embodiment, the additional area 2402 was created by specifically not implanting the dashed P doping regions 1510g within the N epitaxial layer 1304g as shown in FIGS. 21 and 22 so that the P regions or columns 2310' did not thermally diffuse into the N− epitaxial layer 2204 as shown within FIG. 24.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A Super Junction metal oxide semiconductor field effect transistor (MOSFET) device comprising:
   a substrate;
   a charge compensation region located above said substrate and comprising a plurality of columns of P type dopant within an N type dopant region;
   an N− type dopant layer located above said charge compensation region;
   a source, a portion of said source is located above said N− type dopant layer;
   a drain, a portion of said drain is located above said N− type dopant layer; and
   an edge termination structure located between said source and said drain, a portion of said edge termination structure is located above said N− type dopant layer;
   said plurality of columns of P type dopant are similar in height beneath said source, said edge termination structure, and said drain.

2. The Super Junction MOSFET device of claim 1, wherein said edge termination structure comprises a field ring.

3. The Super Junction MOSFET device of claim 2, wherein said field ring is free of physically contacting any of said plurality of columns of P type dopant.

4. The Super Junction MOSFET device of claim 1, further comprising a plurality of edge termination structures.

5. The Super Junction MOSFET device of claim 4, wherein said plurality of edge termination structures comprises a plurality of field rings.

6. The Super Junction MOSFET device of claim 4, wherein said plurality of edge termination structures comprises a plurality of field plates.

7. The Super Junction MOSFET device of claim 1, wherein said edge termination structure comprises a field plate.

8. A Super Junction metal oxide semiconductor field effect transistor (MOSFET) device comprising:
   a substrate;
   a charge compensation region located above said substrate and comprising a plurality of columns of N type dopant within a P type dopant region;
   a P− type dopant layer located above said charge compensation region;
   a source, a portion of said source is located above said P− type dopant layer;
   a drain, a portion of said drain is located above said P− type dopant layer; and
   an edge termination structure located between said source and said drain, a portion of said edge termination structure is located above said P− type dopant layer;
   said plurality of columns of N type dopant are similar in height beneath said source, said edge termination structure, and said drain.

9. The Super Junction MOSFET device of claim 8, wherein said edge termination structure comprises a field ring.

10. The Super Junction MOSFET device of claim 9, wherein said field ring is free of physically contacting any of said plurality of columns of N type dopant.

11. The Super Junction MOSFET device of claim 8, further comprising a plurality of edge termination structures.

12. The Super Junction MOSFET device of claim 11, wherein said plurality of edge termination structures comprises a plurality of field rings.

13. The Super Junction MOSFET device of claim 11, wherein said plurality of edge termination structures comprises a plurality of field plates.

14. The Super Junction MOSFET device of claim 8, wherein said edge termination structure comprises a field plate.

15. A method comprising:
   generating a charge compensation region of a Super Junction metal oxide semiconductor field effect transistor (MOSFET) device, wherein said charge compensation region is located above a substrate and comprising a plurality of columns of first type dopant within a second type dopant region, said Super Junction MOSFET device comprises a source and a drain;
   generating a layer located above said charge compensation region and comprising a second type dopant having a lower concentration than said second type dopant region, a portion of said source is located above said layer, a portion of said drain is located above said layer; and
   generating an edge termination structure located between said source and said drain, a portion of said edge termination structure is located above said layer;
   said plurality of columns of first type dopant are similar in height beneath said source, said edge termination structure, and said drain.

16. The method of claim 15, wherein said first type dopant comprises a P type dopant and said second type dopant comprises an N type dopant.

17. The method of claim 15, wherein said first type dopant comprises an N type dopant and said second type dopant comprises a P type dopant.

18. The method of claim 15, wherein said edge termination structure comprises a field ring.

19. The method of claim 15,
   wherein said edge termination structure comprises a field plate.

20. The method of claim 15, wherein said generating said edge termination structure further comprising generating a plurality of edge termination structures.

* * * * *